US 6,653,713 B2

(12) United States Patent
Takasu

(10) Patent No.: US 6,653,713 B2
(45) Date of Patent: Nov. 25, 2003

(54) THIN FILM RESISTOR WITH STRESS COMPENSATION

(75) Inventor: Hiroaki Takasu, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 09/975,823

(22) Filed: Oct. 12, 2001

(65) Prior Publication Data
US 2002/0096739 A1 Jul. 25, 2002

(30) Foreign Application Priority Data
Oct. 13, 2000 (JP) ........................................ 2000-313777

(51) Int. Cl.$^7$ ................................................ H01L 29/00
(52) U.S. Cl. ...................... 257/538; 257/536; 257/537; 257/528; 438/384
(58) Field of Search ................................ 257/538, 536, 257/537, 528; 438/384

(56) References Cited

U.S. PATENT DOCUMENTS 4,679,170 A * 7/1987 Bourassa et al. ............ 365/154
5,296,726 A * 3/1994 MacElwee .................. 257/213
5,905,296 A * 5/1999 Tuttle ......................... 257/536
6,215,353 B1 * 4/2001 Lewyn ........................ 327/538
6,441,461 B1 * 8/2002 Takasu ........................ 257/538

FOREIGN PATENT DOCUMENTS

JP 55065454 A * 5/1980

* cited by examiner

Primary Examiner—Nathan J. Flynn
Assistant Examiner—Remmon R. Fordé
(74) Attorney, Agent, or Firm—Adams & Wilks

(57) ABSTRACT

A thin film resistor maintains its resistance value when stress is applied so that it may be used in a high precision bleeder resistor circuit to maintain an accurate voltage dividing ratio. The thin film resistor has a P-type thin film resistor formed of a P-type semiconductor thin film and an N-type thin film resistor formed of an N-type semiconductor thin film overlapping the P-type thin film resistor with an insulating layer interposed therebetween, so that a change in resistance value when stress is applied is prevented. In a bleeder resistor circuit, a resistance value of one unit is regulated by a resistance value formed by a combination of the P-type thin film resistor and the N-type thin film resistor so that an accurate voltage dividing ratio can be maintained when stress is applied.

14 Claims, 2 Drawing Sheets

THIN FILM RESISTOR WITH STRESS COMPENSATION

BACKGROUND OF THE INVENTION

1. Field of the Invention

The present invention relates to a semiconductor device, and more particularly to a semiconductor device having a thin film resistor; a bleeder resistance circuit using a thin film resistor; and to a semiconductor device having the bleeder resistance circuit.

2. Description of the Related Art

Conventionally, a resistor made from a semiconductor thin film such as polysilicon and a bleeder resistance circuit using the resistor are used in many cases, and a resistor and a bleeder resistance circuit, which are formed using a semiconductor thin film having a conductivity type of either an N-type or a P-type, have been known.

However, when stress is applied to the conventional thin film resistor, for example, when resin packaging is made, there is a problem in that a resistance value of the thin film resistor is varied. Also, in the case of the bleeder resistance circuit, there is a problem in that a voltage dividing ratio is often varied after the resin packaging.

SUMMARY OF THE INVENTION

The present invention has been made in view of the above, and an object of the present invention is therefore to provide a bleeder resistance circuit with high precision, in which an initial resistance value is kept after packaging and an accurate voltage dividing ratio can be kept in the case of the bleeder resistance circuit, and a semiconductor device with high precision using such a bleeder resistance circuit, for example, a semiconductor device such as a voltage detector or a voltage regulator.

To achieve the above object, means adopted in a semiconductor device of the present invention are as follows. A thin film resistor and a thin film resistor of a bleeder resistance circuit having a plurality of such thin film resistors are comprised of a P-type thin film resistor formed of an N-type semiconductor thin film. Also, the present invention is characterized in that a resistance value which is one unit in the bleeder resistance circuit is defined by a resistance value obtained by a combination of the P-type thin film resistor and the N-type thin film resistor and thus variations in resistance values of the P-type thin film resistor and the N-type thin film resistor by a piezo effect, which are described below, are cancelled by each other. Further, the present invention is characterized in that the P-type thin film resistor and the N-type thin film resistor are laminated in a vertical direction and thus an occupying area of the bleeder resistance circuit is reduced.

Hereinafter, variations in resistance values by the piezo effect and an influence on the bleeder resistance circuit will be described.

When the stress is applied to the thin film resistor, the resistance value of the thin film resistor is varied by a so-called piezo effect, and the resistance value of the P-type thin film resistor is varied in the direction opposite to a variation in the resistance value of the N-type thin film resistor. This is also confirmed by experiments of the present inventor(s). For example, the resistance value of the P-type thin film resistor is decreased and the resistance value of the N-type thin film resistor is increased. The direction of the variation is changed depending on the direction of the stress.

When the IC is packaged by a resin, the stress is produced. Thus, as described above, the resistance value of the thin film resistor is varied by the piezo effect. Although the bleeder resistance circuit is used for obtaining an accurate voltage dividing ratio, since the resistance values of the respective resistors are varied, the voltage dividing ratio is also varied.

The thin film resistor according to the present invention is composed of the P-type thin film resistor made from the P-type semiconductor thin film and the N-type thin film resistor made from the N-type semiconductor thin film. Thus, even if the stress is applied, a variation in the resistance value can be prevented. Also, a resistance value which is one unit in the bleeder resistance circuit is defined by a resistance value obtained by a combination of the P-type thin film resistor and the N-type thin film resistor. Therefore, even if the stress is applied, variations in the resistance values of the respective resistors are cancelled and thus an accurate voltage dividing ratio can be kept. Further, the P-type thin film resistor and the N-type thin film resistor are laminated in a vertical direction, and thus an occupying area of the bleeder resistance circuit can be reduced.

The thin film resistor of the semiconductor device according to the present invention is composed of the P-type thin film resistor made from the P-type semiconductor thin film and the N-type thin film resistor made from the N-type semiconductor thin film. Therefore, even if the stress is applied by resin packaging or the like, variations in the resistance values of the respective resistors are cancelled and thus an initial resistance value can be kept. Also, a resistance value which is one unit in the bleeder resistance circuit is defined by a resistance value obtained by a combination of the P-type thin film resistor and the N-type thin film resistor. Thus, an accurate voltage dividing ratio can be kept. When such a bleeder resistance circuit is used, a semiconductor device with high precision, for example, a semiconductor device such as a voltage detector or a voltage regulator can be obtained. Further, the P-type thin film resistor and the N-type thin film resistor are laminated in a vertical direction, and thus an occupying area of the bleeder resistance circuit can be reduced.

DETAILED DESCRIPTION OF THE PREFERRED EMBODIMENT

Hereinafter, a preferred embodiment of the present invention will be described with reference to the drawings.

Figure 1:
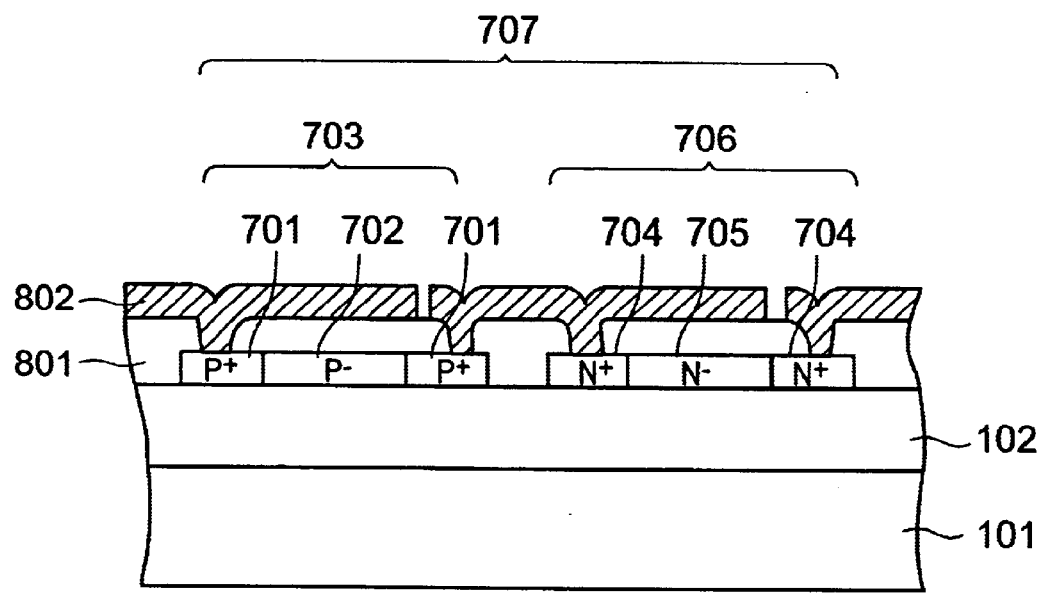
FIG. 1 is a schematic cross sectional view showing a semiconductor thin film resistor in a semiconductor device according to a first embodiment of the present invention.

FIG. 1 is a schematic cross sectional view showing a semiconductor thin film resistor in a semiconductor device according to a first embodiment of the present invention.

A first insulating film 102 is formed on a semiconductor substrate 101. A P-type polysilicon resistor 703 and an N-type polysilicon resistor 706 are formed on the first insulating film 102. The P-type polysilicon resistor 703 has a P-type high resistance region 702 sandwiched between P-type low resistance regions 701 including heavy P-type impurities for making electrical connection with wiring patterns 802. The N-type polysilicon resistor 706 has an N-type high resistance region 705 sandwiched between N-type low resistance regions 704 including heavy N-type impurities for making electrical connection with wiring patterns 802. The wiring patterns 802 made of aluminum are connected with the P-type low resistance regions 701 and the N-type low resistance regions 704. Here, even if stress is applied by resin packaging or the like, a variation in a resistance value of the P-type polysilicon resistor 703 and a variation in a resistance value of the N-type polysilicon resistor 706 can be cancelled by each other. Thus, a resistance value of a resistor 707 obtained by a combination of the P-type polysilicon resistor 703 and the N-type polysilicon resistor 706 can be kept to an initial resistance value.

In FIG. 1, the example of a combination of one P-type polysilicon resistor 703 and one N-type polysilicon resistor 706 is shown. However, the resistor 707 may be formed by a combination of a plurality of the P-type polysilicon resistors 703 and a plurality of the N-type polysilicon resistors 706.

Figure 2:
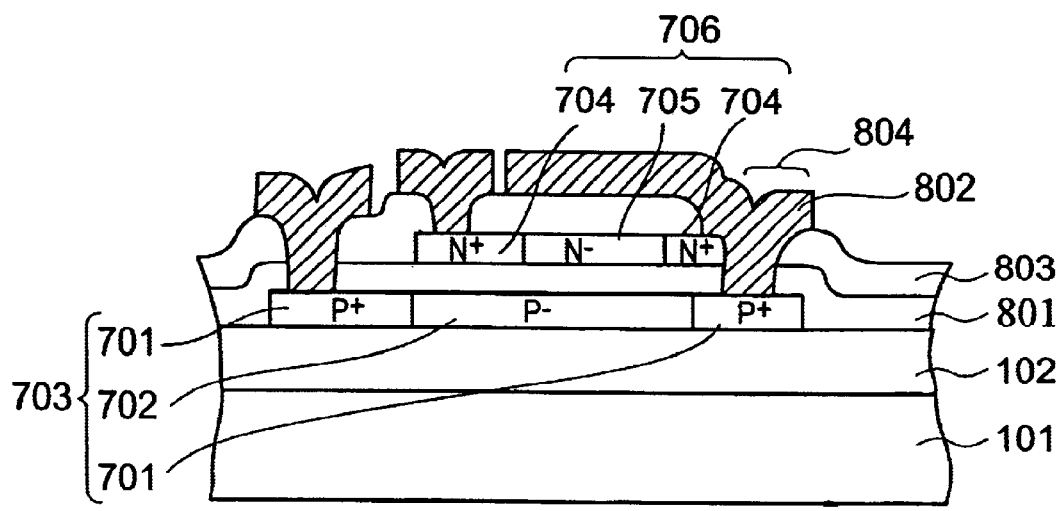
FIG. 2 is a schematic cross sectional view showing a semiconductor thin film resistor in a semiconductor device according to a second embodiment of the present invention.

FIG. 2 is a schematic cross sectional view showing a semiconductor thin film resistor in a semiconductor device according to a second embodiment of the present invention.

The first insulating film 102 is formed on the semiconductor substrate 101. A P-type polysilicon resistor 703 having a P-type high resistance region 702 sandwiched between P-type low resistance regions 701 including heavy P-type impurities for making electrical connection with wirings 802 is formed on the first insulating film 102. Further, an N-type polysilicon resistor 706 having an N-type high resistance region 705 sandwiched between N-type low resistance regions 704 including heavy N-type impurities for making electrical connection with wirings 802 is formed on the P-type polysilicon resistor 703 through a second insulating film 801. Here, one of the P-type low resistance regions 701 and one of the N-type low resistance regions 704 are connected with each other through the wiring 802 made of aluminum in the same contact hole 804. The wiring 802 made of aluminum is extended onto the N-type polysilicon resistor 706. Since the P-type polysilicon resistor 703 and the N-type polysilicon resistor 706 are laminated in a vertical direction, an occupying area of the bleeder resistance circuit in an IC chip can be reduced.

In FIG. 2, the example of a lamination of one P-type polysilicon resistor 703 and one N-type polysilicon resistor 706 is shown. However, the resistor 707 may be formed by a lamination of a plurality of the P-type polysilicon resistors 703 and a plurality of the N-type polysilicon resistors 706. Also, in the example shown in FIG. 2, the N-type polysilicon resistor 706 is formed on the P-type polysilicon resistor 703. However, the P-type polysilicon resistor 703 may be formed on the N-type polysilicon resistor 706.

The resistor 707 obtained by a combination of the P-type polysilicon resistor 703 and the N-type polysilicon resistor 706, as shown in FIGS. 1 and 2, is defined as one unit of the bleeder resistance circuit. Then, a plurality of resistors 707 is formed to construct the entire bleeder resistance circuit. In this manner, even if stress is applied by resin packaging or the like, an accurate voltage dividing ratio can be kept. When such a bleeder resistance circuit is used, a semiconductor device with high precision, for example, a semiconductor device such as a voltage detector or a voltage regulator can be obtained.

Figure 3:
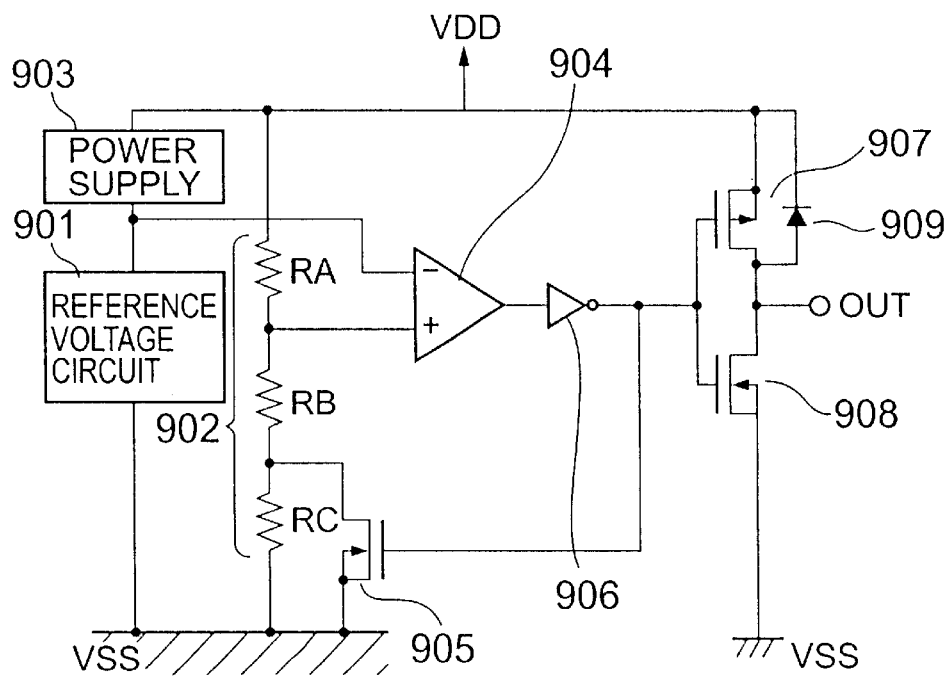
FIG. 3 is a block diagram of one embodiment of a voltage detector using a bleeder resistance circuit according to the present invention.

FIG. 3 is a block diagram of one embodiment of a voltage detector using a bleeder resistance circuit according to the present invention.

For the purpose of simplification, an example of a simple circuit is shown. However, in the case of an actual product, the other functions may be added if necessary.

Basic circuit structure elements of the voltage detector are a current source 903, a reference voltage circuit 901, a bleeder resistance circuit 902, and a differential amplifier 904. Further, an inverter 906, N-type transistors 905 and 908, a P-type transistor 907 and the like are added. Hereinafter, a part of the operation will be simply described.

When a voltage VDD is a predetermined reset voltage or higher, the N-type transistors 905 and 908 are turned OFF and the P-type transistor 907 is turned ON. Thus, the voltage VDD is output to the output terminal OUT.

At this point, the input voltage to the differential amplifier 904 becomes (RB+RC)/(RA+RB+RC)×VDD.

When the voltage VDD decreases and becomes a detection voltage or lower, a voltage VSS is output to the output terminal OUT. At this point, the N-type transistor 905 is turned ON and the input voltage to the differential amplifier 904 becomes RB/(RA+RB)×VDD.

As described above, the basic operation is performed such that the reference voltage generated in the reference voltage circuit 901 is compared with the voltage divided by the bleeder resistance circuit 902 in the differential amplifier 904. Thus, the precision of the voltage divided by the bleeder resistance circuit 902 is very important. If the voltage dividing precision of the bleeder resistance circuit 902 is low, the input voltage to the differential amplifier 904 is varied and the predetermined reset voltage or the predetermined detection voltage is not obtained. When the bleeder resistance circuit according to the present invention is used, the voltage dividing with high precision after an IC is packaged by resin is allowed. Thus, a yield of the product as the IC can be improved and the voltage detector with higher precision can be manufactured.

Figure 4:
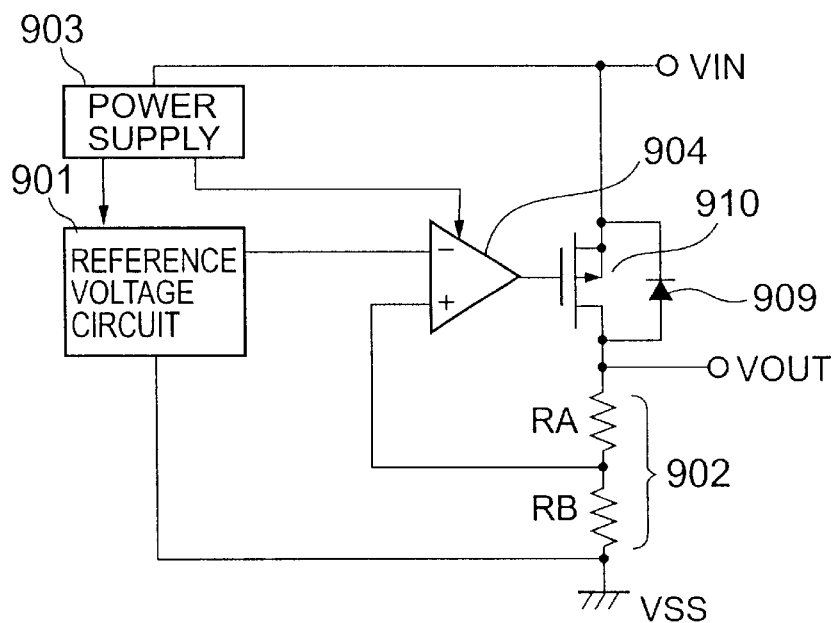
FIG. 4 is a block diagram of one embodiment of a voltage regulator using a bleeder resistance circuit according to the present invention.

FIG. 4 is a block diagram of one embodiment of a voltage regulator using the bleeder resistance circuit according to the present invention.

For the purpose of simplification, an example of a simple circuit is shown. However, in the case of an actual product, the other functions may be added if necessary.

Basic circuit structure elements of the voltage regulator are a current source 903, a reference voltage circuit 901, a bleeder resistance circuit 902, a differential amplifier 904, a P-type transistor 910 which acts as a current controlled transistor, and the like. Hereinafter, a part of the operation will be simply described.

The differential amplifier 904 compares the voltage divided by the bleeder resistance circuit 902 with the reference voltage generated in the reference voltage circuit 901, and then supplies, to the P-type transistor 910, a gate voltage required for obtaining a constant output voltage VOUT which is not influenced by changes in an input voltage VIN and a temperature. In the voltage regulator, as in the case of the voltage detector described in FIG. 3, the basic operation is performed such that the reference voltage generated in the reference voltage circuit 901 is compared with the voltage divided by the bleeder resistance circuit 902 in the differential amplifier 904. Thus, the precision of the voltage divided by the bleeder resistance circuit 902 is very important. If the voltage dividing precision of the bleeder resistance circuit 902 is low, the input voltage to the differential amplifier 904 is varied and the predetermined output voltage VOUT is not obtained. When the bleeder resistance circuit according to the present invention is used, the voltage dividing with high precision after an IC is packaged by resin is allowed. Thus, the yield of the product as the IC can be improved and the voltage regulator with higher precision can be manufactured.

As described above, the thin film resistor of the semiconductor device according to the present invention is composed of the P-type thin film resistor made from the P-type semiconductor thin film and the N-type thin film resistor made from the N-type semiconductor thin film. Therefore, even if stress is applied by resin packaging or the like, variations in resistance values of respective resistors are cancelled and thus an initial resistance value can be kept. Also, in the bleeder resistance circuit, a resistance value as one unit is defined by a resistance value obtained by a combination of the P-type thin film resistor and the N-type thin film resistor. Thus, an accurate voltage dividing ratio can be kept. Further, since the P-type thin film resistor and the N-type thin film resistor are laminated, an area of the bleeder resistance circuit can be reduced. When such a bleeder resistance circuit is used, there is an effect that a semiconductor device with high precision, for example, a semiconductor device such as a voltage detector or a voltage regulator can be obtained with a small chip size.

What is claimed is:

1. A semiconductor device having a thin film resistor element, the thin film resistor element comprising: a P-type thin film resistor formed of a P-type semiconductor thin film; an N-type thin film resistor formed of an N-type semiconductor thin film overlapping the P-type thin film resistor; and an insulating layer interposed between the P-type thin film resistor and the N-type thin film resistor, the P-type thin film resistor and the N-type thin film resistor being connected to each other through the insulating layer such that a stress-induced resistance variation in one of the thin film resistors is canceled by an inverse stress-induced resistance variation in the other thin film resistor.

2. A semiconductor device according to claim 1; wherein the insulating layer has a through-hole therein for allowing electrical connection of the P-type thin film resistor and the N-type thin film resistor.

3. A semiconductor device according to claim 2; wherein the P-type thin film resistor comprises a high resistance region formed in the P-type semiconductor thin film and low resistance contact regions formed in the P-type semiconductor thin film sandwiching the high resistance region.

4. A semiconductor device according to claim 3; wherein the P-type semiconductor thin film is formed of polysilicon.

5. A semiconductor device according to claim 3; wherein the N-type thin film resistor comprises a high resistance region formed in the N-type semiconductor thin film and low resistance contact regions formed in the N-type semiconductor thin film sandwiching the high resistance region.

6. A semiconductor device according to claim 5; wherein the N-type semiconductor thin film is formed of polysilicon.

7. A semiconductor device according to claim 5; further comprising a wiring pattern formed over the thin film resistors and connected to selected ones of the low resistance contact regions of the P-type thin film resistor and the N-type thin film resistor through the through-hole formed in the insulating layer.

8. A semiconductor device according to claim 1; wherein the thin film resistor element comprises a resistor of a bleeder resistor circuit having a plurality of resistors each comprising one thin film resistor element, a resistance value of each of the thin film resistor elements being formed by a combination of the P-type thin film resistor and the N-type thin film resistor.

9. A semiconductor device according to claim 1; wherein the thin film resistor element is formed of polysilicon.

10. A semiconductor device according to claim 1; wherein the P-type thin film resistor is arranged in sufficiently close proximity to the N-type thin film resistor so that a stress-induced increase in resistance in one of the P-type and N-type thin film resistors is canceled by a stress-induced decrease in resistance in the other of the P-type and N-type thin film resistors.

11. A voltage detector comprising: a power source for producing a power source signal; a reference voltage generating circuit for generating a reference voltage; a voltage divider circuit having a plurality of resistors for dividing the power source signal and producing a divided power source signal; and an error amplifier for inputting the reference voltage and the divided power source signal and outputting an error signal based upon a comparison therebetween; wherein the voltage divider circuit is formed of a plurality of the thin film resistor elements according to claim 1.

12. A thin film resistor element comprising: a P-type thin film resistor formed of a P-type semiconductor thin film; and an N-type thin film resistor formed of an N-type semiconductor thin film overlapping the P-type thin film resistor; and an insulating layer interposed between the P-type thin film resistor and the N-type thin film resistor, the thin film resistors being connected to each other such that a stress-induced increase in resistance in one of the thin film resistors is canceled by a stress-induced decrease in resistance in the other of the thin film resistors.

13. A thin film resistor element according to claim 12; wherein the P-type thin film resistor and the N-type thin film resistor are formed of polysilicon thin films.

14. A thin film resistor element according to claim 12; wherein the thin film resistor element comprises a resistor of a bleeder resistor circuit having a plurality of resistors each comprising one thin film resistor element, a resistance value of each of the thin film resistor elements being formed by a combination of the P-type thin film resistor and the N-type thin film resistor.

* * * * *